(12) United States Patent
Taylor

(10) Patent No.: US 6,914,439 B2
(45) Date of Patent: Jul. 5, 2005

(54) CAPACITIVE TEST POINT VOLTAGE AND PHASING DETECTOR

(75) Inventor: Timothy R. Taylor, Easton, PA (US)

(73) Assignee: Thomas & Betts International, Inc., Sparks, NV (US)

( * ) Notice: Subject to any disclaimer, the term of this patent is extended or adjusted under 35 U.S.C. 154(b) by 0 days.

(21) Appl. No.: 10/723,678

(22) Filed: Nov. 25, 2003

(65) Prior Publication Data

US 2004/0075449 A1 Apr. 22, 2004

Related U.S. Application Data

(62) Division of application No. 10/033,118, filed on Oct. 26, 2001, now Pat. No. 6,677,741.

(51) Int. Cl.[7] .......................... G01R 27/26; G01R 25/00
(52) U.S. Cl. .................... 324/683; 324/76.52; 324/72.5; 702/72
(58) Field of Search ......................... 324/72.5, 72, 609, 324/633, 683, 76.77, 149, 76.52; 702/72

(56) References Cited

U.S. PATENT DOCUMENTS

| 3,392,334 | A | | 7/1968 | Bevins ........................ 324/149 |
| 3,866,117 | A | | 2/1975 | Erdman ....................... 324/514 |
| 4,016,492 | A | * | 4/1977 | Miller et al. ................. 324/128 |
| 4,316,254 | A | | 2/1982 | Levin ........................... 702/72 |
| 4,492,918 | A | | 1/1985 | Hernandez et al. ....... 324/76.77 |
| 5,136,234 | A | | 8/1992 | Shaw ........................... 324/72 |
| 6,126,462 | A | | 10/2000 | Lam ........................... 439/171 |

* cited by examiner

*Primary Examiner*—Vincent Q. Nguyen
(74) *Attorney, Agent, or Firm*—Hoffman & Baron, LLP

(57) ABSTRACT

Method and apparatus for accurately determining the presence of voltage at capacitive test points and for determining the phase angle relationship between two capacitive points. The detection of the presence of the voltage at the capacitive test points is independent of the voltage range in the systems, independent of the contamination or defects that may occur in the capacitive test point systems. The phase angle relationship is determined based on the actual phase angle difference between the voltage waveforms at the capacitive test points independent of the capacitive divider ratio difference and the capacitive test point voltage accuracy.

13 Claims, 4 Drawing Sheets

WAVEFORMS FOR IN-PHASE:
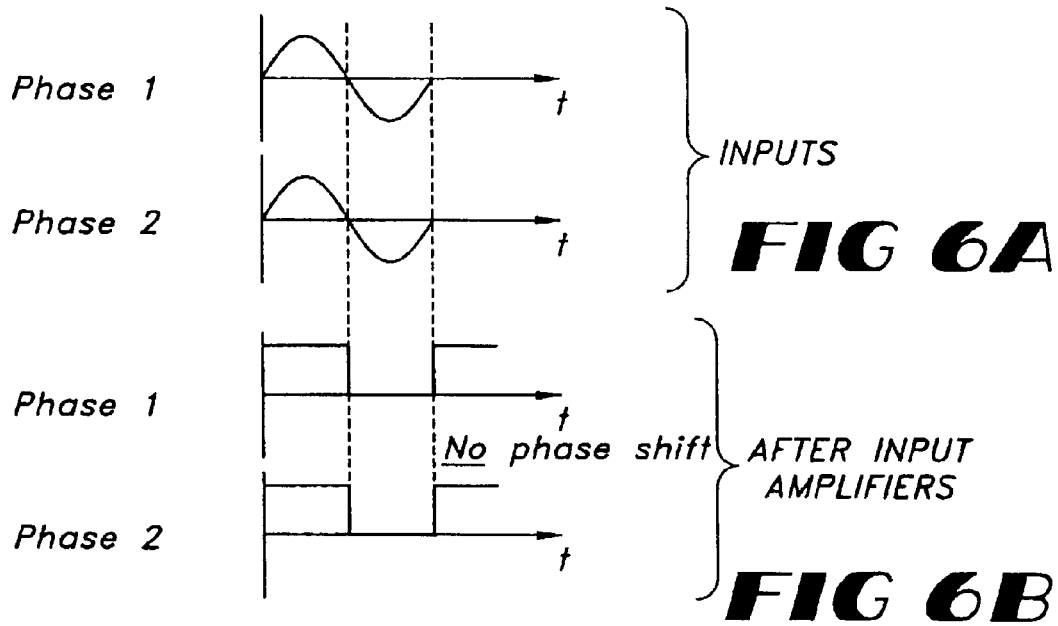
FIG 6A
FIG 6B
WAVEFORMS FOR OUT-OF-PHASE:
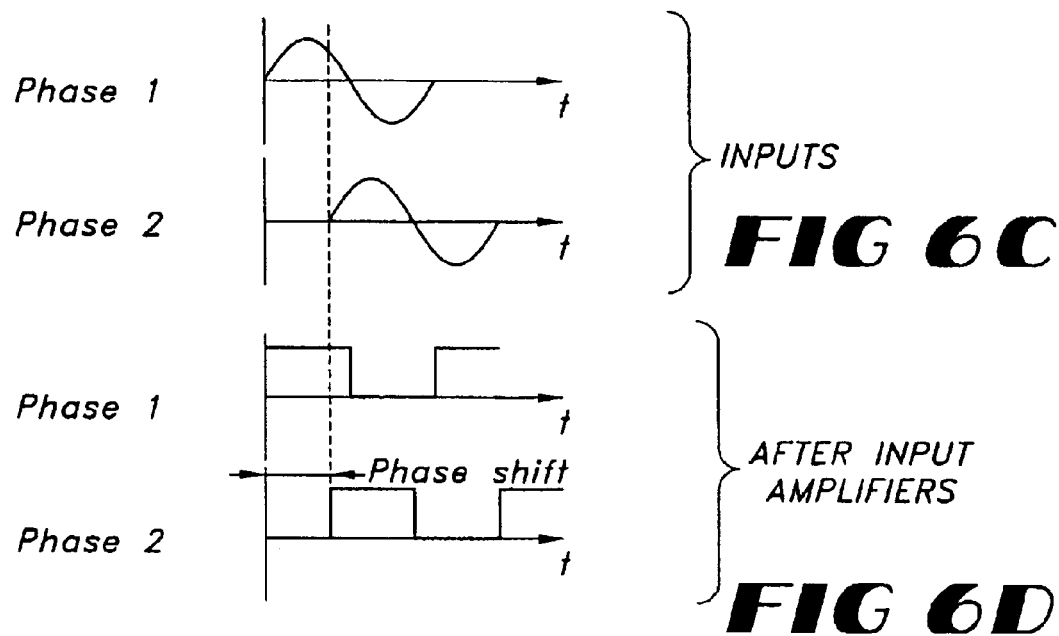
FIG 6C
FIG 6D

CAPACITIVE TEST POINT VOLTAGE AND PHASING DETECTOR

CROSS-REFERENCE TO RELATED APPLICATIONS

This application is a divisional of U.S. patent application Ser. No. 10/033,118, filed Oct. 26, 2001 U.S. Pat. No. 6,677,741.

FIELD OF THE INVENTION

The present invention relates generally to a method and apparatus for determining the presence of voltage and determining the phase relationship between capacitive test points. More specifically, the present invention is directed to determining the presence of voltage at capacitive test points and measuring the actual phase angle difference between the two capacitive test points in order to determine the phase relationship between the two capacitive test points.

BACKGROUND OF THE INVENTION

In the past, the phase relationship between two capacitive test points was determined based on voltage measurements at the capacitive test points. Ideally, the voltage difference between the two capacitive test points would be zero if in phase and significantly larger if out of phase. However, due to the fact that the test point capacitive divider ratio can vary significantly from one test point to another, a large voltage difference between the two capacitive test points could occur due to the capacitive divider ratio difference and not due to the phase angle difference between the two capacitive test points. Therefore, the wrong conclusion could be reached regarding the phase relationship between the two capacitive test points. Moreover the prior art devices used to measure the phase relationship have a very high input impedance, which makes these devices very sensitive to contamination on the capacitive test point insulation surface, thus, giving an inaccurate voltage reading at the capacitive test points.

In general, the capacitive test point systems operate in the range of 15 KV(kilovolts) to 35 kV (kilovolts). In the past, the devices used for measuring the voltage and phase angle relationships between the two capacitive test points are often known to indicate no presence of voltage at the capacitive test points due to factors such as contamination at the capacitive test point insulation surface and any defects in the capacitive test point system itself.

Thus, a need exists to detect the phase relationship between capactive test points independent of the capacitive divider ratio difference and the capacitive test point voltage accuracy. Also, there is a need for a capacitive test point voltage and phasing detector with a very low input impedance and also capable of accurately detecting the presence of voltage in the capacitive test points independent of the voltage range in the systems, independent of any contamination or defects that may occur in the systems.

SUMMARY OF THE INVENTION

It is an object of the present invention to provide an apparatus and method of detecting the phase relationship between the capacitive test points which is completely independent of both the capacitive divider ratio variations and the capacitive test point voltage accuracy. The present invention provides a capacitive test point voltage and phasing detector which determines the phase relationship between two capacitive test points based on the actual phase angle difference between the two capacitive test points. A voltage waveform, that is, a signal is received at each capacitive test point. The actual phase angle difference is determined based on any phase shift between the two voltage waveforms, independent of the actual voltage difference between the two capacitive test points.

It is a further object of the present invention to provide an apparatus and method of ensuring that both the capacitive test points are energized indicating that the voltage is present at both the capacitive test points. This protects the possibility of errors occurring if both the points are not energized. In other words, the present invention provides a capacitive test point voltage and phasing detector which determines the presence of voltage at both the capacitive test points, which prevents it from providing an indication that the voltages are in or out of phase unless both the capacitive points are energized. This further eliminates any possibility of errors that might occur in determining the phase angle relationship between the two capacitive test points.

It is another object of the present invention to provide a capacitive test point voltage and phasing detector which has a very low input impedance minimizing the effects of contamination on the capacitive test point insulation surface. Thus, giving an even more reliable reading of the phase angle relationship between the two capacitive test points.

It is still a further object of the present invention to provide a capacitive test point voltage and phasing detector which is capable of accurately detecting the presence of voltage in the capacitive test points independent of the voltage range in the systems, independent of any contamination or defects that may occur in the capacitive test point systems.

BRIEF DESCRIPTION OF THE DRAWINGS

FIG. 6A–FIG. 6D illustrates the phase relationship in accordance with the present invention.

DETAILED DESCRIPTION OF THE INVENTION

Figure 1:
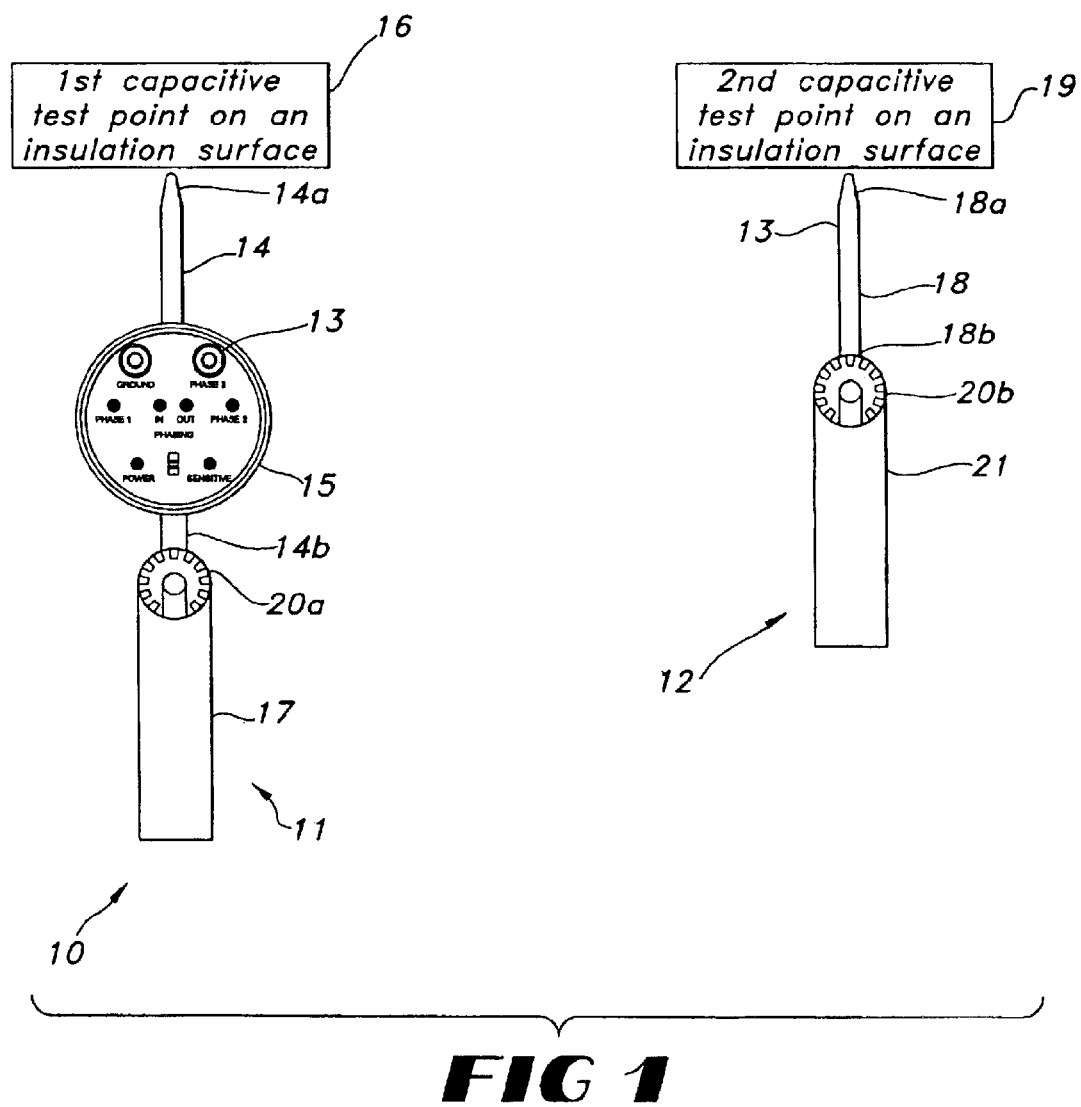
FIG. 1 illustrates a capacitive test point voltage and phasing detector of the present invention in use in an environment shown schematically.

Referring now to FIG. 1, a capacitive test point voltage and phasing detector 10 is shown in use in an environment which is shown schematically. The capacitive test point voltage and phasing detector 10 generally includes a first detector member 11 and a second detector member 12 which are in electrical communication with each other by a phase 2 lead 13, which is merely a wire. Preferably the first detector member 11 includes a longitudinally extended first probe 14 having a pointed upper end 14a and a lower end 14b. The first detector member 11 also includes a circular shaped module 15 connected between the upper and the lower end of the first probe 14. The first probe 14 is configured to engage with a first capacitive point 16 at the pointed upper end 14a to take a voltage reading. The first probe 14 is electrically coupled to the module 15. Moreover, a first universal adapter 16 is connected to the lower end of the first probe 14 to facilitate the attachment of the first detector member 11 to the non-conductive stick 17 for use by a technician in the field.

Similarly, the second detector member 12 also includes a longitudinally extended second probe 18 having a pointed upper end 18a and a lower end 18b. The second probe 18 is configured to engage with a second capacitive point 19 at the pointed upper end 18a to take a voltage reading. The second probe 18 is electrically coupled to the module 15 through the phase 2 lead 13. Moreover, a second universal adapter 20 is connected to the lower end of the second probe 18 to facilitate the attachment of the second detector member 12 to the non-conductive stick 21 for use by a technician in the field. Both the first and second probes are made from an electrically conductive material. Preferably the first and second probes are made from aluminum.

Figure 2:
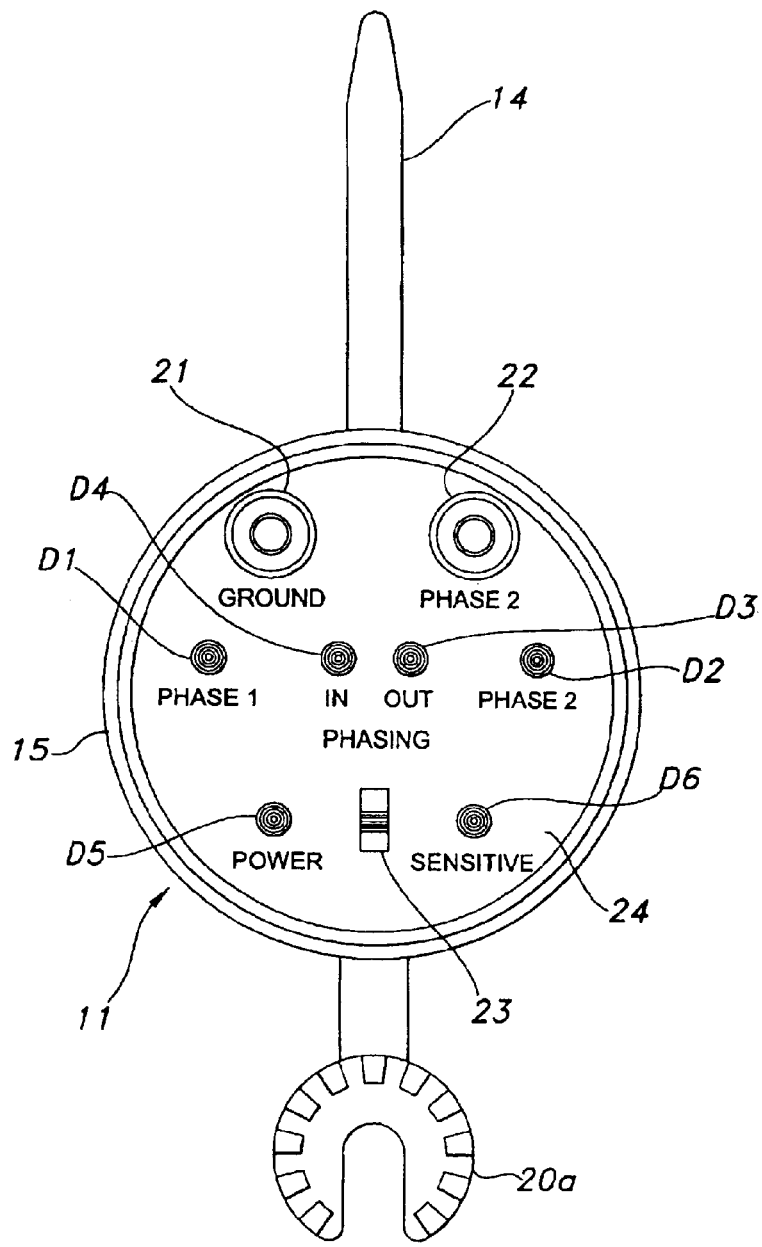
FIG. 2 shows in detail the first detector member of the capacitive test point voltage and phasing detector of the present invention.

The first detector member of the capacitive test point voltage and phasing detector of FIG. 1 is shown in further detail in FIG. 2. The first detector member 11 includes a first probe 14 and a first universal adapter 16. The first detector member 11 also includes module 15, which preferably includes a display 20 and is configured to measure the actual phase angle difference between the first and second capacitive test points for determining the phase relationship between the capacitive test points. The module 15 also includes a ground jack 21 for connecting a ground lead to the system ground. A phase 2 jack 22 is also mounted on the module 15 for accommodating one end of the phase 2 lead wire 13 in FIG. 1. The module 15 is configured to enclose a battery to power the detector and includes a switch 23 to physically turn the power on or off of the detector. Preferably the display 20 includes a plurality of light emitting diodes D1 through D6 together with textual indicia or icons for providing the indication. The power diode D5 is a light emitting diode which provides an indication that the detector is turned on or off and blinks to indicate that the battery is getting low. The module display 20 also includes a sensitive indicator D6 on the module, which is a light emitting diode, which provides an indication that the detector is in sensitive mode. Moreover the phase 1 diode D1 on the display indicates the presence of the voltage at the first capacitive test point and the phase 2 diode D2 indicates the presence of the voltage at the second capacitive test point. Finally the module display includes an indication of whether the voltages are in or out of phase on the module display through diodes D4 and D3 respectively, thereby representing the phase angle relationship between the voltage at the first capacitive test point and the voltage at the second capacitive test point.

The operation of the detector 10 will now be explained with reference to both FIGS. 1 and 2. Initially the detector 10 is turned on with the switch 23 and LED D5 will light to acknowledge that the detector 10 is on. After the detector 10 is turned on, each technician will engage a probe with a capacitive test point. If both capacitive test points are energized, both the PHASE 1 and PHASE 2 LED's, D1 and D2 respectively will light and the display will provide and indication whether the voltages are in or out of phase. If the voltages are in phase, LED D4 will be lit preferably a green light. However, if the voltages are out of phase, LED D3 will be lit preferably a red light. If either or both capacitive test points are not energized, no indication as to whether the voltages are in or out of phase will be provided. That is, both LED's D3 and D4 will not be lit. In addition, the technician will be able to identify which capacitive test point or points are not energized because the corresponding LED's D1 and D2 will not be lit. For example, if the first capacitive test point 16 was not energized and the second capacitive test point 19 is energized LED's D1, D4, and D3 will not be lit, but LED D2 will be lit.

Figure 3:
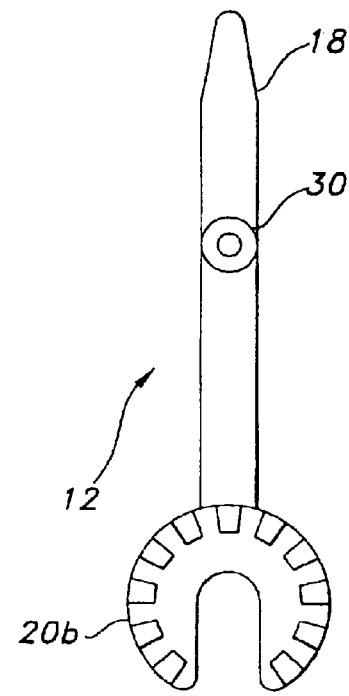
FIG. 3 is a detailed top view of the second detector member of the capacitive test point voltage and phasing detector of the present invention.

Referring now to FIG. 3 the second detector member 12 of the capacitive test point voltage and phasing detector is shown in further detail. Besides including the second probe 18 and the second universal adapter 20, it also includes a second probe jack 30 for accommodating the other end of the phase 2 lead wire 13 in FIG. 1.

Figure 4:
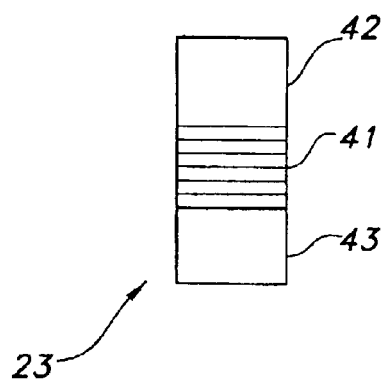
FIG. 4 shows the switch of the detector in accordance with the present invention.

FIG. 4 shows in detail the switch 23 of the module display. The switch 23 includes three positions from which a technician can select. The middle position 41, which is the "off" position, indicates that the capacitive test point voltage and phasing detector is turned off. The upward position 42, the "on" position indicating that the detector is turned on and is in normal mode. The down position, 43 is called the sensitive position which also indicates that the power to the detector is turned on and is in a sensitive mode, and has some special features which will be explained hereto. In general, the capacitive test point systems operate in the range of 15 kV (kilovolts) to 35 kV (kilovolts). It is known in the past that when a technician uses the detector in the "on" position 42, there will be a false indication of no voltage present at the capacitive test points if the system voltage is below 15 KV(kilovolts). The diodes D1 and D2 in FIG. 2 will not lite up even though there is voltage present at the two capacitive test points. This is due to the fact that the voltage is below the threshold of the detector. Therefore, under this scenario, the technician can switch to the sensitive position, 43 of the switch 23. When the switch is in sensitive position, 43, diodes D1 and D2 will light up, giving an accurate indication that there is a presence of voltage at both capacitive test points. Also, sometimes due to contamination at the capacitive test point insulation surface and/or defects in the test point system itself can give a false representation of no voltage present at the capacitive test points to the technician when the switch 23 is at "on" position, 42. Again, by switching to the sensitive position 43, under these conditions, the technician will be provided with an accurate reading of the presence of voltage at the capacitive test points. The sensitive mode negates the factors such as contamination in the capacitive test points, the defects in the test point system itself and the fact that the test point systems is operating at a low voltage, and therefore, gives an accurate indication of presence of voltage independent of these factors.

Figure 5:
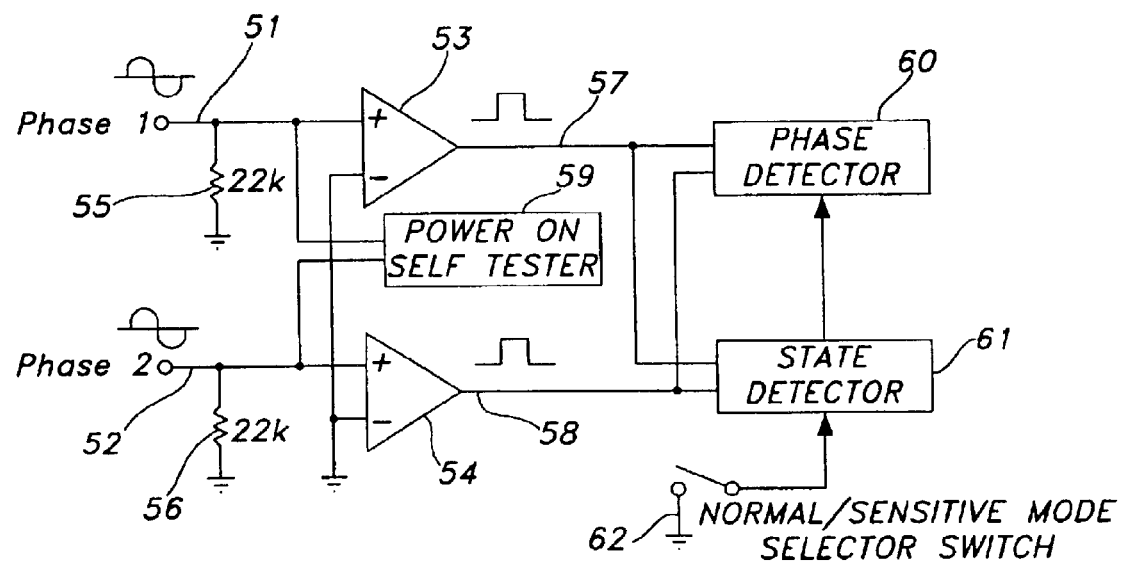
FIG. 5 is a block diagram illustrating the phase detector circuitry according to the present invention.

The first detector member of FIG. 2 includes a block diagram shown in FIG. 5 illustrating phase detector circuitry. The input 51 of FIG. 5 is the voltage reading that is being taken at the first capacitive test point 16 through the first probe 14 of FIG. 1 and the input 52 of FIG. 5 is the voltage reading being taken at the second capacitive test point 19 through the second probe 18 of FIG. 1. The voltage readings are waveforms indicating the presence of voltage at the two capacitive test points. The voltage waveforms are sinusoidal waveforms as shown in FIGS. 6A and 6C as phase 1 and phase 2 representing the inputs 51 and 52 respectively of FIG. 5. The voltage waveform at input 51 is the input to operational amplifier 53 and voltage waveform at input 52 is the input to operation amplifier 54. The operational amplifiers 53 and 54 of FIG. 5 are connected to ground through resistors 55 and 56 respectively. Resistors 55 and 56 are generally in the magnitude of tens of kohms, preferably 22 kohms. Because the resistors 55 and 56 are at much lower values, the input impedance in the operational amplifiers 53 and 54 is very low. The low input impedance can reliably determine that the capacitive test point is energized even when the test point is severely degraded, providing signal data that can be used to reliably determine of the phase relationship between two capacitive test points. Also, the low input impedance is much less susceptible to noise.

The operational amplifier 53 receives as input 51, the sinusoidal waveforms phase 1 of FIG. 6A and FIG. 6C, and the operational amplifier 54 receives as input 52 the sinusoidal waveforms phase 2 of FIG. 6A and FIG. 6C. The output 57 of the amplifier 53 are square waveforms phase 1 of FIG. 6B and FIG. 6D. The output 58 of the amplifier 54 are square waveforms phase 2 of FIG. 6B and FIG. 6D.

The block diagram of FIG. 5 also includes a power on self-tester 59, which is also an input to the operational amplifiers 53 and 54. The power on self-tester 59 provides an indication that the detector is functioning properly by applying test waveforms to the phase 1 input 51 and the phase 2 input 52 of FIG. 5. The test waveforms apply an in phase condition for approximately 2 seconds and then an out of phase condition for an additional 2 seconds causing diodes D1 through D4 of FIG. 2 to illuminate accordingly.

The output waveforms 57 and 58 if FIG. 5 are input to the phase detector 60 which determines the phase angle relationship between the voltage at the first capacitive test point and the voltage at the second capacitive test point. In particular, the phase detector preferably determines whether the voltages are in or out of phase and provides an indication of same on the display through LED's D4 and D3 as shown in FIG. 2. As shown in FIG. 6B, as the square waves in phase 1 and phase 2 go high or low at the same time indicates the voltages at both the capacitive test points are in phase. In FIG. 6D, however, the square waves of phase 1 and phase 2 go high or low at different times, indicating a phase shift, i.e. the voltages are out of phase with respect to each other.

Preferably the block diagram of FIG. 5 also includes a state detector 61 coupled to receiving the output waveforms 57 and 58. The switch 62, similar to the switch in FIG. 3 and 5 having normal and sensitive mode, is connected to the state detector 61. The state detector 61 ensures that both the first capacitive test points and second capacitive test points are energized for protecting against the possibility of errors occurring when one or both points are not energized. The state detector 61 prevents the phase detector 60 from providing an indication that the voltages are in or out of phase unless both capacitive test points are energized. This prevents technicians from reaching a wrong conclusion when one or both capacitive test points are not energized. If both test points were not energized and the circuit did not include a state detector 61, the phase detector 60 would determine that the voltages at the first and second capacitive test points were in phase. In other words, the state detector 61 is configured to provide an indication when voltage is present at a capacitive test point.

While the invention has been described by the foregoing detailed description in relation to the preferred embodiments with several examples, it will be understood by those skilled in the art that various changes may be made to specific methods and circuitry as set forth in the present invention without deviating from the spirit and scope of the invention as defined in the appended claims.

What is claimed is:

1. A method for determining a phase angle relationship between capacitive test points, comprising the steps of:
   receiving a first waveform indicating the presence of a voltage at first capacitive test point;
   receiving a second waveform indicating the presence of a voltage at a second capacitive test point;
   comparing the first and second waveforms with respect to time;
   measuring a phase angle difference between the first and the second waveforms independent of voltage values at the first and the second capacitive points; and
   determining the phase angle relationship between the first and the second capacitive test points based on said phase angle difference.

2. The method of claim 1, further comprising:
   displaying the phase angle relationship between the first and second capacitive test points.

3. The method of claim 1, wherein the phase angle difference determines whether the voltages at the first and the second capacitive test points are in phase.

4. The method of claim 1, wherein the phage angle difference determines whether the voltages at the first and the second capacitive test points are out of phase.

5. The method of claim 1, wherein the phase angle difference is independent of contamination at first and second capacitive test points.

6. An apparatus for detecting a phase angle relationship between two capacitive test points, comprising:
   a first amplifier having an input and output, including a first resistor connected to the input of the first amplifier for providing a low input impedance at the first amplifier;
   a first voltage channel connected to the input of the first amplifier for receiving first voltage signal from a first capacitive test point;
   a second amplifier having an input and output, including a second resistor connected to the input of the second amplifier for providing a low input impedance at the second amplifier;
   a second voltage channel connected to the input of the second amplifier for receiving second voltage signal from a second capacitive test point;
   a power on self-tester coupled to send test voltage signals to the first and second amplifiers for testing the functionality of the apparatus;
   a first output voltage signal received from the output of the first amplifier;
   a second output voltage signal received from the output of the second amplifier;
   a phase detector coupled to receive the first and second output voltage signals, wherein the phase detector determines a phase angle difference between the first and the second output voltage signals independent of voltage values at the first and second capacitive points;
   a state detector coupled to receive the first and second output voltage signals; and
   a switch connected to the state detector.

7. The apparatus of claim 6, wherein the phase angle difference determines whether voltages at the first and second capacitive test points are in phase.

8. The apparatus of claim 6, wherein the phase angle difference determines whether voltages at the first and second capacitive test points are out of phase.

9. The apparatus of claim 6, wherein the phase angel difference is independent of the contamination at the first and the second capacitive test points.

10. The apparatus of claim 6, wherein the first and second resistors are in the magnitude of tens of kiloohms.

11. The apparatus of claim 10, wherein the first and second resistors are measured at 22 kiloohms.

12. The apparatus of claim 6, wherein the state detector accurately indicates that a voltage is present at the first and second capacitive test points.

13. The apparatus of claim 12, wherein the state detector sends a signal to the phase detector when the voltage is present at the first and second capacitive test points.

* * * * *